(12) United States Patent
Seo

(10) Patent No.: US 12,181,492 B1
(45) Date of Patent: Dec. 31, 2024

(54) PROBE HEAD AND SUBSTRATE INSPECTION DEVICE INCLUDING THE SAME

(71) Applicant: Kee Bok Seo, Seoul (KR)

(72) Inventor: Kee Bok Seo, Seoul (KR)

( * ) Notice: Subject to any disclaimer, the term of this patent is extended or adjusted under 35 U.S.C. 154(b) by 0 days.

(21) Appl. No.: 18/594,257

(22) Filed: Mar. 4, 2024

(30) Foreign Application Priority Data

Feb. 19, 2024 (KR) .................. 10-2024-0023878

(51) Int. Cl.
| | | |
|---|---|---|
| *G01R 1/04* | (2006.01) | |
| *G01R 1/02* | (2006.01) | |
| *G01R 1/067* | (2006.01) | |
| *G01R 1/073* | (2006.01) | |
| *G01R 31/28* | (2006.01) | |

(52) U.S. Cl.
CPC .......... *G01R 1/04* (2013.01); *G01R 31/2887* (2013.01)

(58) Field of Classification Search
CPC . G01R 1/02; G01R 1/04; G01R 1/067; G01R 1/073; G01R 31/00; G01R 31/02; G01R 31/28; G01R 31/2887
See application file for complete search history.

(56) References Cited

U.S. PATENT DOCUMENTS

| | | | | |
|---|---|---|---|---|
| 4,918,383 A | | 4/1990 | Huff et al. | |
| 5,825,192 A | * | 10/1998 | Hagihara | ........... G01R 31/2887 |
| | | | | 324/762.01 |
| 6,060,891 A | * | 5/2000 | Hembree | ............... G01R 1/073 |
| | | | | 324/755.04 |
| 2003/0174035 A1 | | 9/2003 | Arima | |
| 2023/0209277 A1 | | 6/2023 | Yokota | |

FOREIGN PATENT DOCUMENTS

| | | |
|---|---|---|
| JP | 2016-223996 A | 12/2016 |
| KR | 10-0312835 B1 | 11/2001 |
| KR | 10-1157449 B1 | 6/2012 |
| KR | 10-2023-0106933 A | 7/2023 |
| KR | 10-2023-0122670 A | 8/2023 |

* cited by examiner

*Primary Examiner* — Neel D Shah
(74) *Attorney, Agent, or Firm* — The PL Law Group, PLLC

(57) ABSTRACT

A probe head includes a test board configured to test a reliability of a semiconductor substrate by contacting the semiconductor substrate, a load pusher provided on the test board, the load pusher including a frame, a plurality of elastic structures, and a loader blade, the frame having a penetration region, the plurality of elastic structures extending from an inner surface of the frame within the penetration region and spaced apart from each other along a circumferential direction, the loader blade configured to protrude the test board toward the semiconductor substrate, the loader blade connecting to the frame through the plurality of elastic structures, and a support tensioner configured to support the load pusher.

4 Claims, 12 Drawing Sheets

PROBE HEAD AND SUBSTRATE INSPECTION DEVICE INCLUDING THE SAME

CROSS-REFERENCE TO RELATED APPLICATION AND CLAIM OF PRIORITY

This application claims priority under 35 U.S.C. § 119 to Korean Patent Application No. 10-2024-0023878, filed on Feb. 19, 2024 in the Korean Intellectual Property Office (KIPO), the contents of which are herein incorporated by reference in their entirety.

BACKGROUND

1. Field

Example embodiments relate to a probe head and a substrate inspection device including the same. More particularly, example embodiments relate to a probe head for testing a reliability of a semiconductor substrate and a substrate inspection device including the same.

2. Description of the Related Art

Tests on semiconductor wafers may be performed by a probing process in a wafer level chip scale package (WLCSP). High-performance probe cards such as membrane probe cards may be used in the probing process. A probe head of the membrane probe card may include two leaf spring structures. The probe head may have limited movement due to the two leaf spring structures. When the probing process is performed on an edge portion of a wafer or a defective solder ball, stress may be applied on the semiconductor wafer or the probe head and damage may be occurred due to limited travel distance of the probe head. When epoxy is used in the probe head of a membrane probe card, the testing might not be performed for a long time at high or extremely low temperatures.

SUMMARY

Example embodiments provide a probe head having a structure capable of preventing damage on a semiconductor wafer and allowing long-term inspection.

Example embodiments provide a substrate inspection device including the probe head.

According to example embodiments, a probe head includes a test board configured to test a reliability of a semiconductor substrate by contacting the semiconductor substrate, a load pusher provided on the test board, the load pusher including a frame, a plurality of elastic structures, and a loader blade, the frame having a penetration region, the plurality of elastic structures extending from an inner surface of the frame within the penetration region and spaced apart from each other along a circumferential direction, the loader blade configured to protrude the test board toward the semiconductor substrate, the loader blade connecting to the frame through the plurality of elastic structures, and a support tensioner configured to support the load pusher.

According to example embodiments, each of the plurality of elastic structures has a meander structure extending in a zigzag pattern with repeated regular units.

According to example embodiments, each of the plurality of elastic structures includes a plurality of first extending portions extending in a vertical direction and having a first width in a horizontal direction perpendicular to the vertical direction, and a plurality of second extending portions extending between the plurality of first extending portions and having a second width smaller than the first width in the horizontal direction.

According to example embodiments, each of the plurality of elastic structures has a first surface and a second surface opposite to the second surface, each of the plurality of elastic structures has a plurality of first and second patterns respectively extending from the first and second surfaces toward each other.

According to example embodiments, each of the plurality of elastic structures has a first surface and a second surface opposite to the second surface, each of the plurality of elastic structures has a plurality of third patterns respectively extending from the first surface.

According to example embodiments, a probe head includes a test board configured to test a reliability of a semiconductor substrate by contacting the semiconductor substrate, a load pusher including a frame, a plurality of elastic structures, and a loader blade, the frame having a penetration region, the plurality of elastic structures extending from an inner surface of the frame within the penetration region and spaced apart from each other along a circumferential direction, the loader blade having an upper surface and a lower surface opposite to the supper surface, the loader blade configured to protrude the test board toward the semiconductor substrate through the lower surface, the loader blade connecting to the frame through the plurality of elastic structures, and a support tensioner configured to be arranged on the upper surface of the loader blade, the support tensioner having a plurality of spring pins to limit movement of the loader blade.

According to example embodiments, the plurality of spring pins are arranged to be symmetrical to each other with respect to first and second reference axes, respectively, the first reference axis passes through a central axis of the loader blade, the second reference axis passes through the central axis and perpendicular to the first reference axis.

According to example embodiments, each of the plurality of spring pins includes a cylindrical body having opened one side, a contact pin provided on the opened one side inside the body and in contact with the upper surface, and a spring applying elastic force to the contact pin within the body toward the opened one side.

According to example embodiments, the number of the plurality of spring pins is within a range of 30 to 50.

According to example embodiments, the plurality of spring pins and the load pusher at least one of copper (Cu), aluminum (Al), tungsten (W), nickel (Ni), molybdenum (Mo), gold (Au), silver (Ag), chromium (Cr), tin (Sn) and titanium (Ti).

According to example embodiments, a probe head may include a test board configured to test a reliability of a semiconductor substrate by contacting the semiconductor substrate, a load pusher provided on the test board, the load pusher including a frame, a plurality of elastic structures, and a loader blade, the frame having a penetration region, the plurality of elastic structures extending from an inner surface of the frame within the penetration region and spaced apart from each other along a circumferential direction, the loader blade configured to protrude the test board toward the semiconductor substrate, the loader blade connecting to the frame through the plurality of elastic structures, and a support tensioner configured to support the load pusher.

Thus, the load pusher of the probe head may contact the test board onto the semiconductor substrate, and the test board may test the reliability of the semiconductor substrate. While the load pusher presses the test board toward the semiconductor substrate, the plurality of elastic structures may support rotation motion of the loader blade.

Since the plurality of elastic structures are spaced apart from each other along the circumferential direction to have a predetermined angle, while the loader blade presses the test board onto the semiconductor substrate, the plurality of elastic structures may stably support the loader blade.

Since the loader blade is rotated by the plurality of elastic structures, when the test board is located on an edge region of a semiconductor wafer, the loader blade may evenly transmit external force onto the semiconductor substrate. Since the loader blade evenly transmits the external force onto the semiconductor substrate, damage occurring within the semiconductor substrate may be reduced, and damage of the load pusher may be prevented.

Also, the frame, the plurality of elastic structures, and the loader blade may include a same material. The frame, the plurality of elastic structures, and the loader blade may be provided as integrated structure. Since the frame, the plurality of elastic structures, and the loader blade are formed as integrated structure and do not have epoxy for bonding, the probe head may perform reliability tests at high or extremely low temperatures for a long time.

BRIEF DESCRIPTION OF THE DRAWINGS

Example embodiments will be more clearly understood from the following detailed description taken in conjunction with the accompanying drawings.

FIG. 1 is a perspective view illustrating a substrate inspection device in accordance with example embodiments.

FIG. 2 is a perspective view illustrating a probe head in accordance with example embodiments.

FIG. 3 is a front view illustrating the probe head in FIG. 2.

FIG. 4 is a perspective view illustrating the load pusher in FIG. 3.

FIG. 5 is a view illustrating the load pusher in FIG. 4.

FIG. 6 is a cross-sectional view taken along the line A-A' in FIG. 5.

FIG. 7 is a perspective view illustrating the support tensioner in FIG. 2.

FIG. 8 is a view illustrating a probe head having the support tensioner in FIG. 7.

FIG. 9 is a front view illustrating a probe head in a process of testing a reliability of a semiconductor substrate using the substrate inspection device in FIG. 1.

FIG. 10 is a view illustrating the load pusher in FIG. 9 in a process of testing a reliability of a semiconductor substrate.

FIGS. 11 and 12 are view illustrating load pushers in accordance with example embodiments.

DETAILED DESCRIPTION OF EXAMPLE EMBODIMENTS

Hereinafter, example embodiments will be explained in detail with reference to the accompanying drawings.

Figure 1:
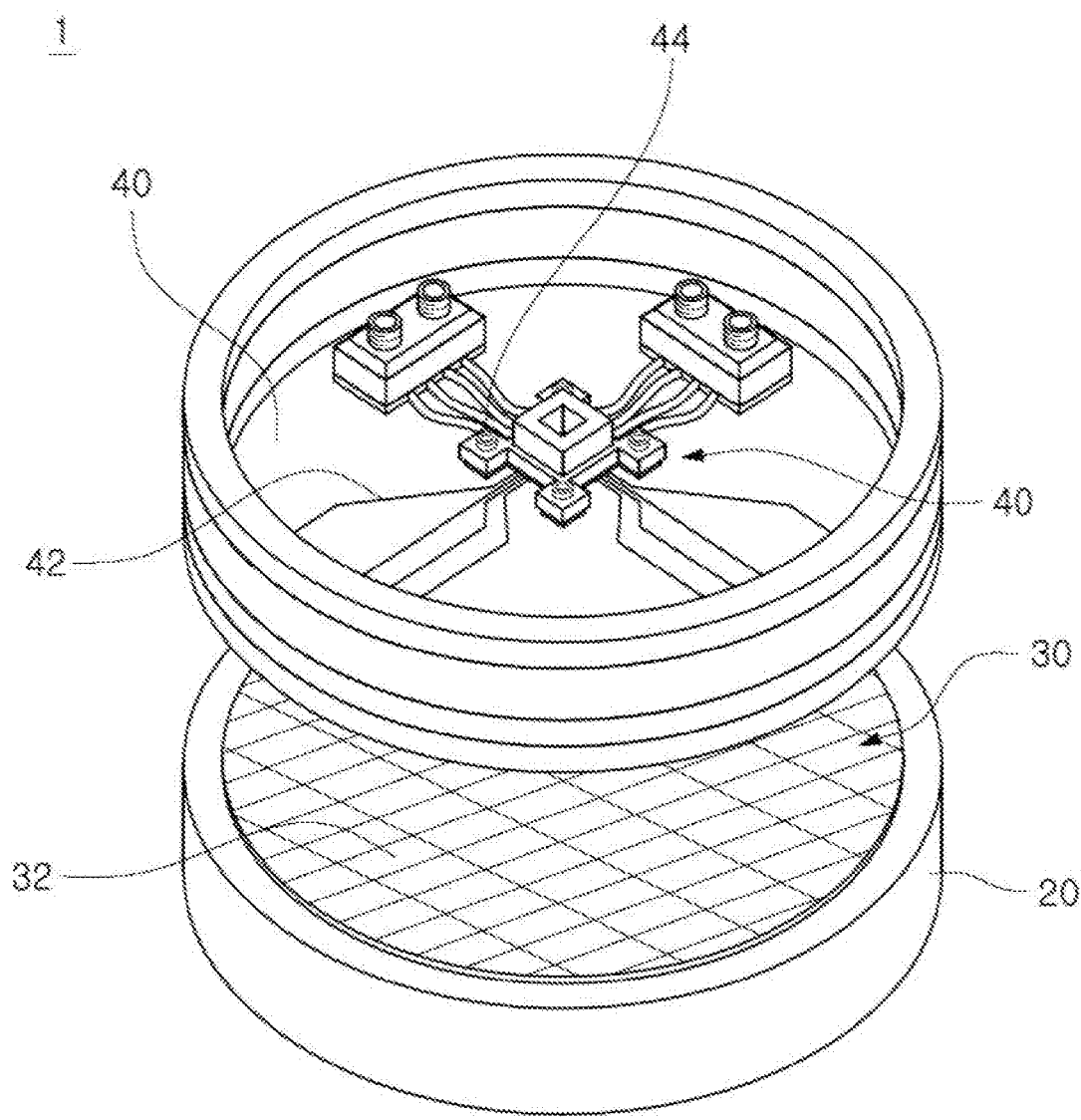
FIGS. 1 to 12 represent non-limiting, example embodiments as described herein.

FIG. 1 is a perspective view illustrating a substrate inspection device in accordance with example embodiments.

Referring to FIG. 1, a substrate inspection device 1 may include a substrate plate 20 and a probe head 10. The substrate inspection device 1 may perform a reliability test to test a reliability of a semiconductor substrate 30 loaded on the substrate plate 20. For example, the substrate inspection device 1 may perform the reliability test onto the semiconductor substrate 30 by a probing process in a wafer level chip scale package (WLCSP) state. The substrate inspection device 1 may perform a micro-process onto the semiconductor substrate 30.

The semiconductor substrate 30 may include a plurality of semiconductor chips 32. Each of the plurality of semiconductor chips 32 may include an electronic circuit, the electronic circuit may include bonding pads, connecting pads, solder bumps, etc. for transmitting and receiving electrical signals. For example, the semiconductor substrate 30 may include a semiconductor wafer.

The substrate plate 20 may function as a susceptor to support the semiconductor substrate 30. The substrate plate 20 may include an electrostatic chuck to maintain the semiconductor substrate 30 by electrostatic attraction. The electrostatic chuck may adsorb and hold the semiconductor substrate 30 with electrostatic force using a direct current voltage that is supplied from a direct current power source. A semiconductor substrate 30 may be mounted on a support surface of the electrostatic chuck, and a focus ring may be provided around the semiconductor substrate 30.

The substrate inspection device 1 may be provided below the probe head 10 and may move the substrate plate 20 that is loaded with the semiconductor substrate 30. The substrate inspection device 1 may freely move the substrate plate 20 in three-dimensional space. The substrate inspection device 1 may move the substrate plate 20, may perform the reliability test by moving the semiconductor substrate 30 loaded on the substrate plate 20 into contact with the probe head 10. Alternatively, the substrate inspection device 1 may freely move the probe head 10 in the three-dimensional space.

The substrate inspection device 1 may include a probe card 40 on which a signal line 42 is disposed on. A data signal may move within the signal line 42. For example, the probe card 40 may include a high-performance probe card such as a membrane probe card.

The probe card 40 may include a support structure 44 for fixing the probe head 10. For example, the support structure 44 may include a polymer. The support structure 44 may fix the probe head 10 through bolts and nuts. The probe head 10 may be attached and detached to the probe card 40 through the bolt and nut. The probe card 40 may be separated from the substrate inspection device 1 through the support structure 44, and the probe card 40 may be exchanged depending on a type of the reliability test.

The Probe card 40 may include a central opening. The probe card 40 may expose at least a portion of the probe head 10 toward the semiconductor substrate 30 through the central opening. The probe head 10 exposed from the central opening of the probe card 40 may contact the semiconductor substrate 30 to perform the reliability test.

Hereinafter, the probe head of the substrate inspection device will be described in more detail.

Figure 2:
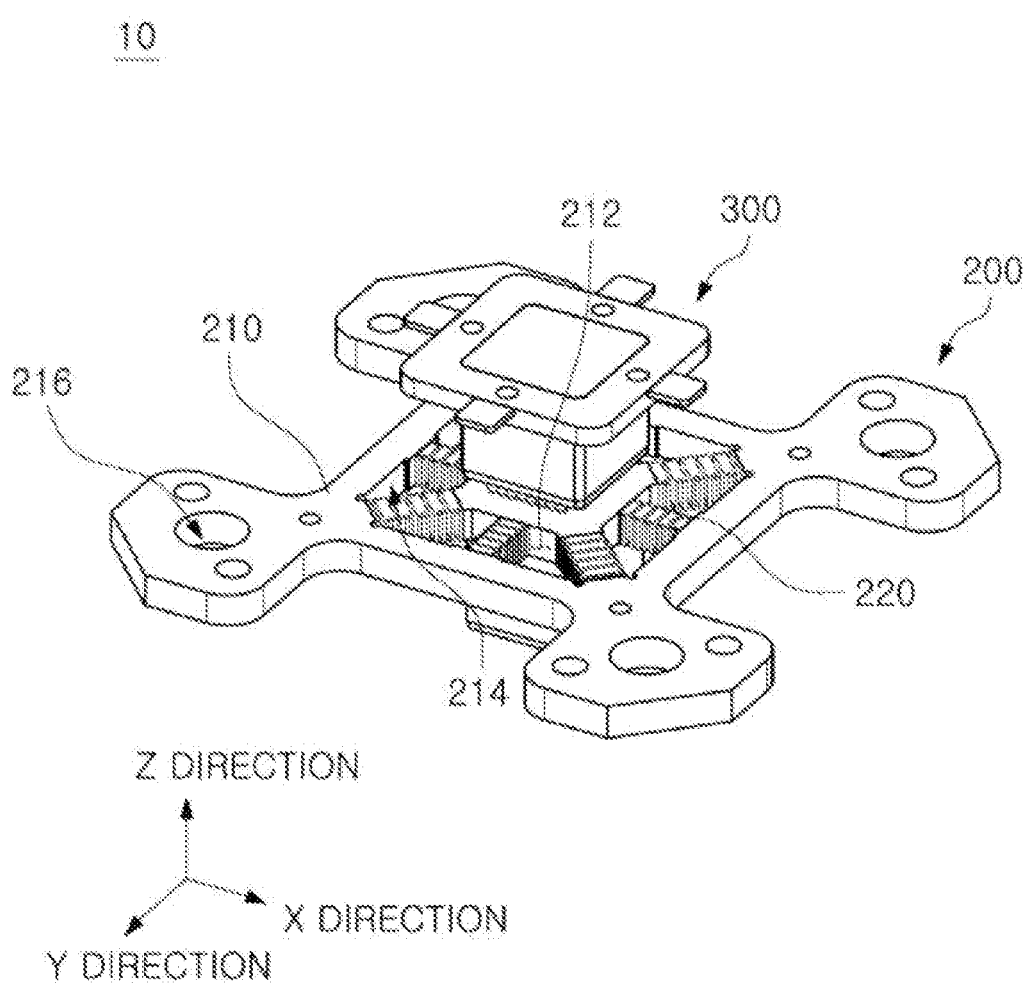
Figure 3:
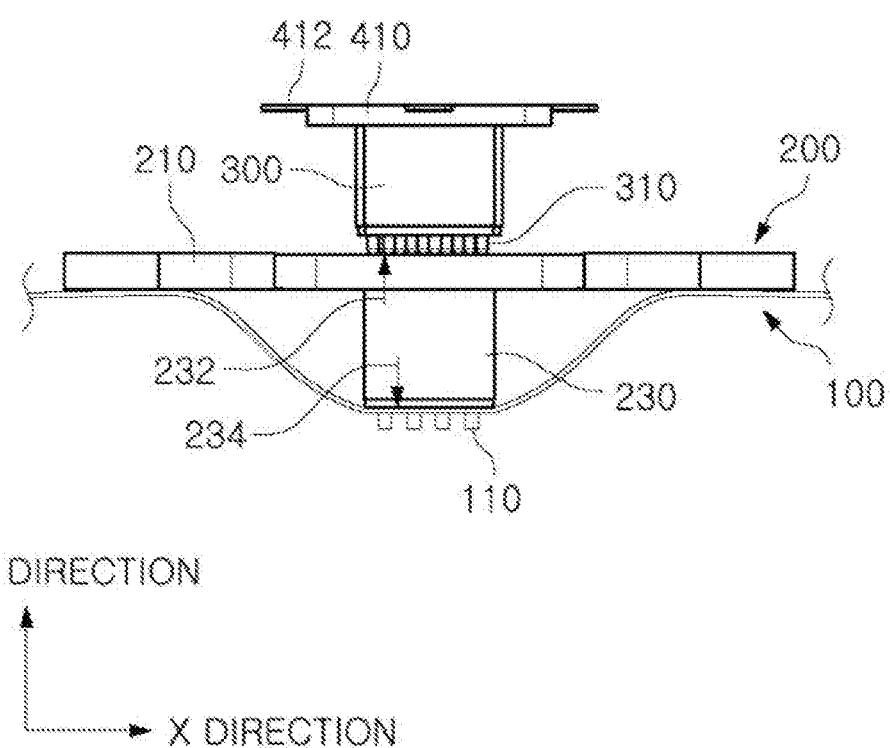
Figure 4:
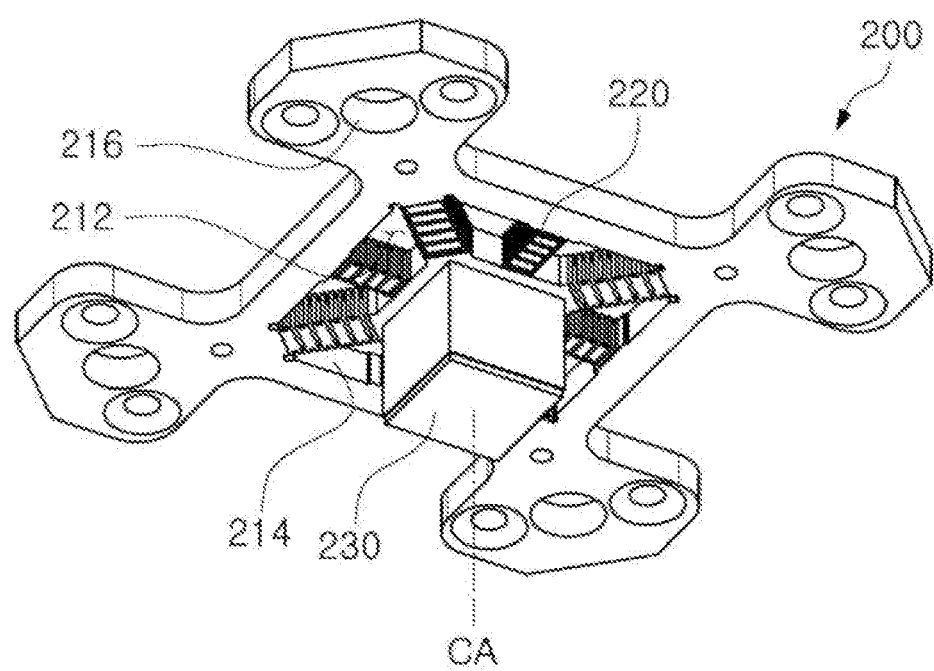
Figure 4:
Figure 5:
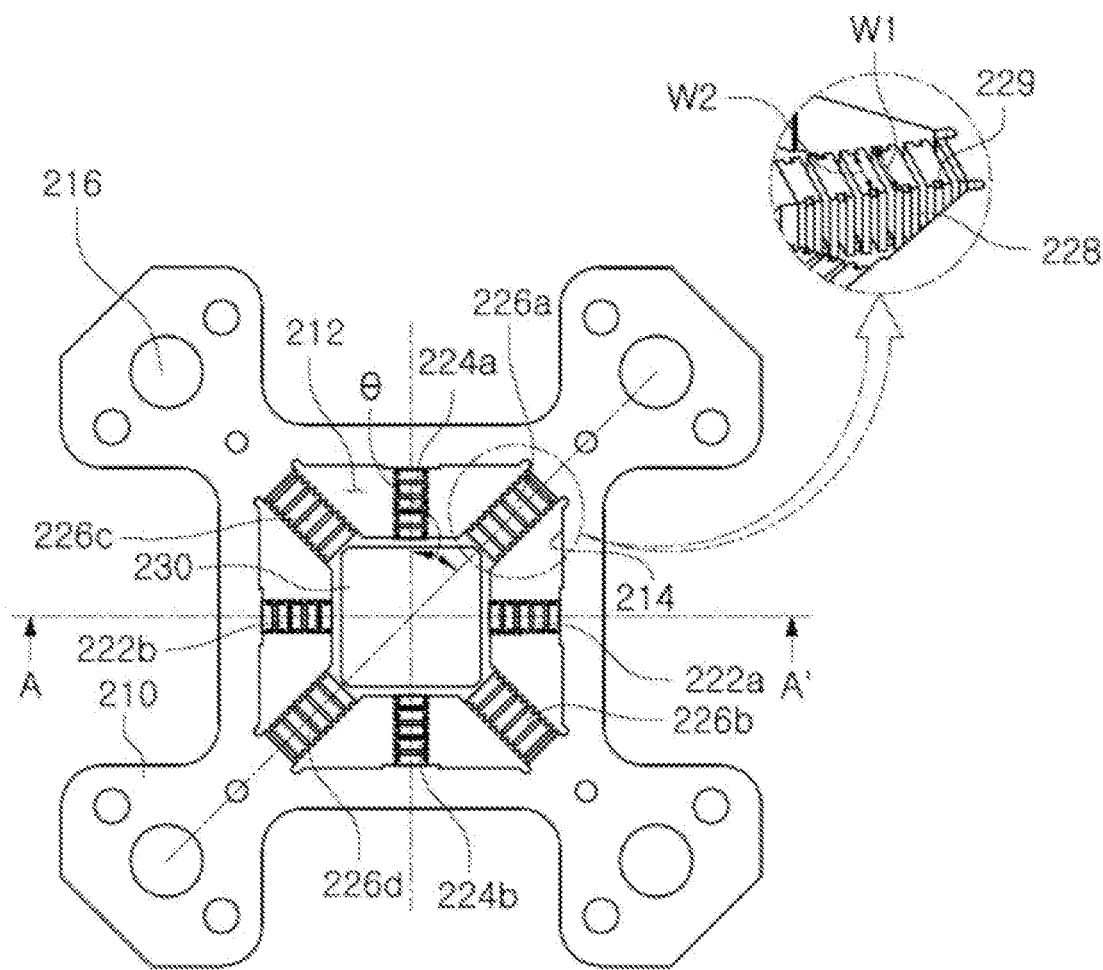
Figure 6:
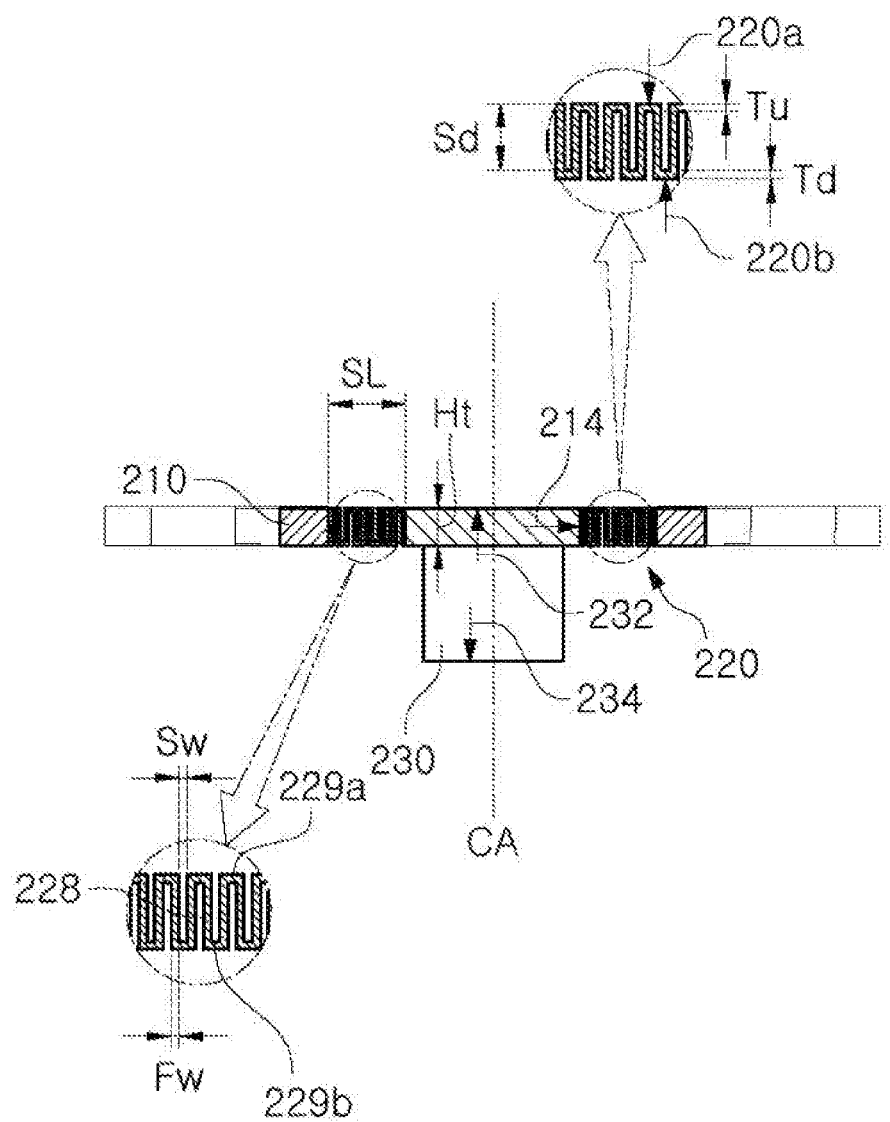
Figure 7:
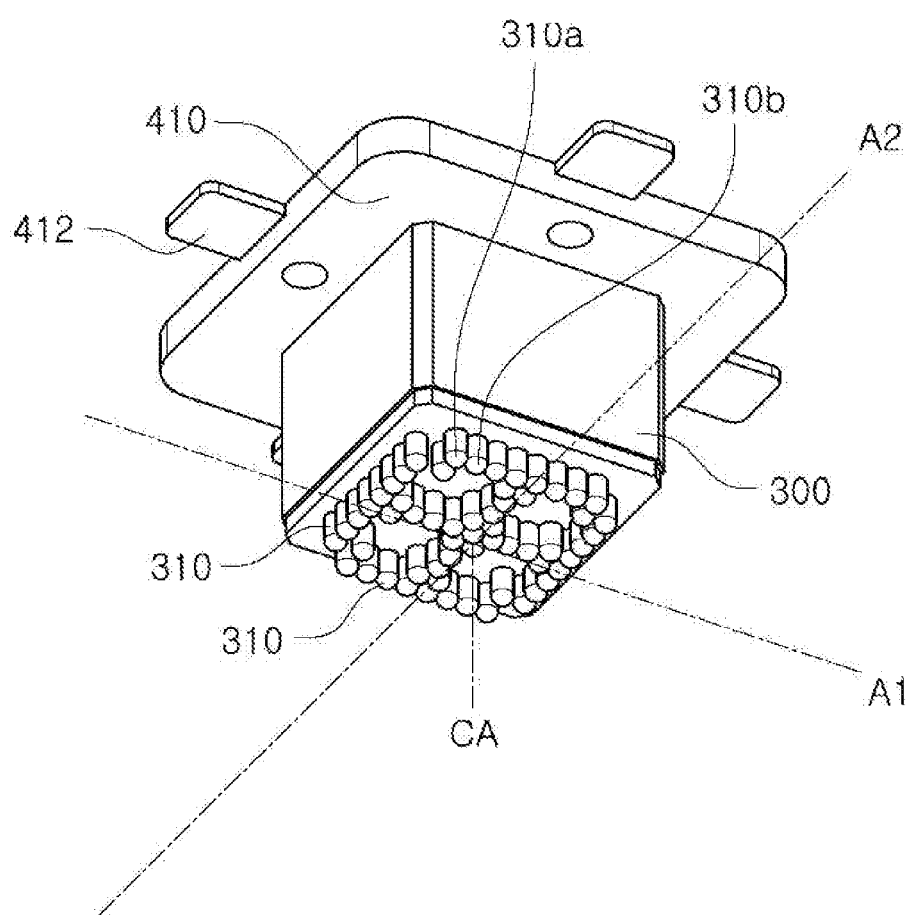
Figure 8:
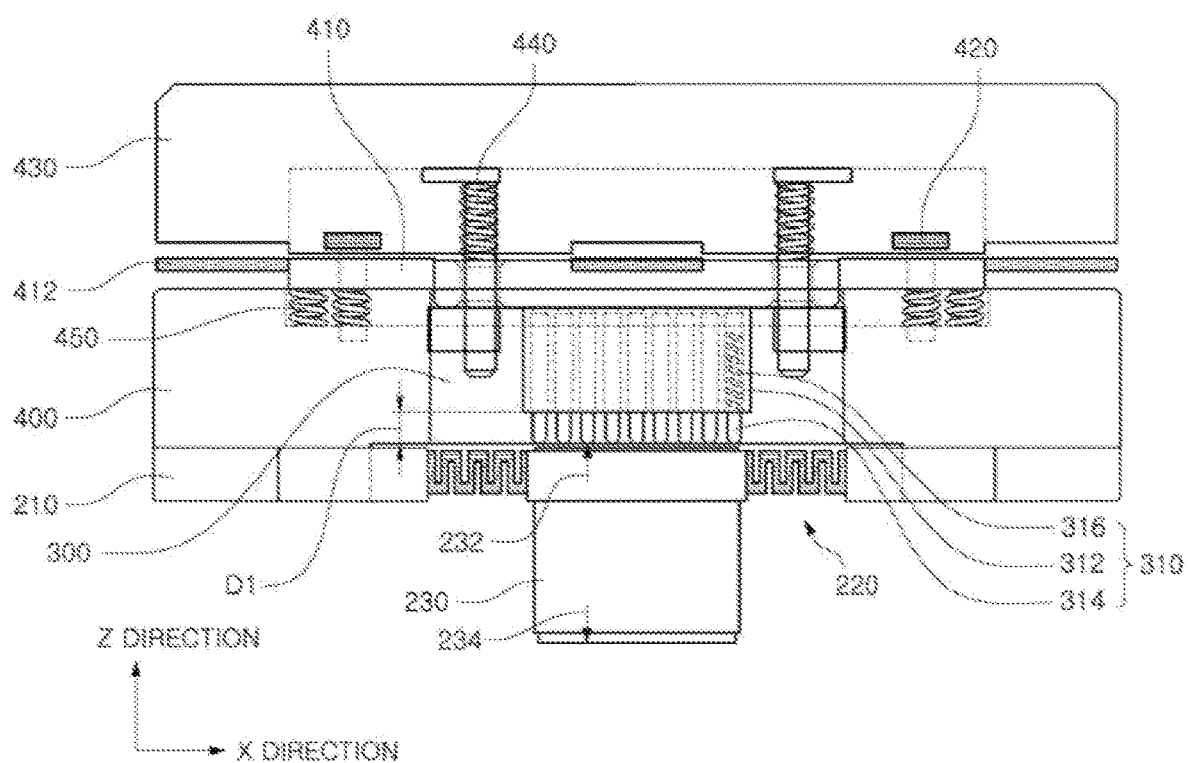

FIG. 2 is a perspective view illustrating a probe head in accordance with example embodiments. FIG. 3 is a front view illustrating the probe head in FIG. 2. FIG. 4 is a perspective view illustrating the load pusher in FIG. 3. FIG. 5 is a view illustrating the load pusher in FIG. 4. FIG. 6 is a cross-sectional view taken along the line A-A' in FIG. 5. FIG. 7 is a perspective view illustrating the support tensioner in FIG. 2. FIG. 8 is a view illustrating a probe head having the support tensioner in FIG. 7.

Referring to FIGS. 1 to 8, the probe head 10 may include a test board 100 configured to test the reliability of the semiconductor substrate 30, a load pusher 200 configured to press the test board 100 onto the semiconductor substrate 30, and a support tensioner 300 configured to support the load pusher 200. The probe head 10 may be referred to as a probe socket. The probe head 10 may be used as a socket. For example, when the probe head 10 is used as the socket, the probe head may be used as a connector socket that connects component portions within the substrate inspection device 1. The connector socket may be used without limitation as a component for connecting the component portions of the substrate inspection device 1.

The probe head 10 may be provided on the probe card 40. The probe head 10 may be electrically connected to the signal line 42 through which the data signal moves. The probe head 10 may transmit and receive the data signal by contacting the semiconductor substrate 30 loaded on the substrate plate 20, and may test the reliability of the semiconductor substrate 30 through the data signal. For example, the probe head 10 may be referred to as a dolphin probe head.

In example embodiments, the test board 100 may contact the semiconductor substrate 30 to test the reliability of the semiconductor substrate 30. The test board 100 may be electrically connected to the signal line 42 through which the data signal moves. The test board 100 may have a flexible structure. For example, the test board 100 may include a printed circuit board (PCB). The test board 100 may include a flexible printed circuit board (FPCB).

The test board 100 may be provided below the load pusher 200. The test board 100 may be aligned by an alignment pin provided on the probe card, and the test board 100 may be attached below the load pusher 200. The test board 100 may have flexibility. Since the test board 100 has the flexibility, the test board 100 may be bent to have a curvature below the load pusher 200.

The test board 100 may include an insulating film, a plurality of data signal lines to be provided within the insulating film, and a plurality of tips 110 electrically connected to the plurality of data signal lines. For example, the insulating film may include polyimide.

The plurality of data signal lines may be provided within the insulating film, and the plurality of tips 110 may be exposed from the insulating film. The plurality of data signal lines may be electrically connected to the signal line 42, and may transmit and receive the data signal. The plurality of tips 110 may directly contact the bonding pad, the connecting pad, the solder bump, etc. of the semiconductor substrate 30. The plurality of tips 110 may be electrically connected to the semiconductor substrate 30, the reliability test may be performed while the data signal moves through the semiconductor substrate 30, the plurality of tips 110, the plurality of data signal lines, and the signal line 42.

In example embodiments, the load pusher 200 may have an upper portion and a lower portion opposite to the upper portion. The load pusher 200 may place the support tensioner 300 on the upper portion. The load pusher 200 may be provided on the test board 100. The load pusher 200 may include a frame 210 having a penetration region 212, a plurality of elastic structures 220 provided in the penetration region 212, and a loader blade 230 protruding the test board 100 toward the semiconductor substrate 30.

In example embodiments, the frame 210 may have the penetration region 212. The frame 210 may have an inner surface 214 formed through the penetration region 212. The loader blade 230 may be provided at a center of the penetration region 212. For example, when viewed in plan view, the penetration region 212 may include a rectangular shape, a circular shape, etc.

For example, the frame 210 may include a first metal material. The frame 210 may include copper (Cu), aluminum (Al), tungsten (W), nickel (Ni), molybdenum (Mo), gold (Au), silver (Ag), chromium (Cr), tin (Sn), and titanium (Ti).

The frame 210 may be attached and detached to the probe card 40 through the bolt and the nut. The frame 210 may have a plurality of openings 216 through which the bolt may penetrate. The frame 210 may be fixed on the probe card 40 through the bolt and the nut. Since the frame 210 is fixed on the probe card 40 through the bolt and the nut, when the load pusher 200 presses the test board 100 onto the semiconductor substrate 30, the probe head 10 may be stably fixed.

In example embodiments, the plurality of elastic structures 220 may be provided within the penetration region 212 of the frame 210. The plurality of elastic structures 220 may support the loader blade 230 within the penetration region 212 of the frame 210. The plurality of elastic structures 220 may stably support the loader blade 230 in the center of the penetration region 212. The plurality of elastic structures 220 may have a structure that generates elastic force. Each of the plurality of elastic structures 220 may have a first surface 220a and a second surface 220b opposite to the first surface 220a. The plurality of elastic structures 220 may have a three-dimensional spring structure.

Since the plurality of elastic structures 220 support the loader blade 230, when the loader blade 230 presses the test board 100 onto the semiconductor substrate 30, the plurality of elastic structures 220 may rotate the loader blade 230 through the elastic force. The loader blade 230 may freely rotate in the three-dimensional space. Since the loader blade 230 rotates through the plurality of elastic structures 220, when the loader blade 230 presses the test board 100 onto the semiconductor substrate 30, damage occurring within the semiconductor substrate 30 may be prevented.

The plurality of elastic structures 220 may extend from the inner surface 214 of the frame 210. The plurality of elastic structures 220 may be arranged to be spaced apart from each other along a circumferential direction. The plurality of elastic structures 220 may be arranged to have a predetermined angle θ between adjacent elastic structures 224a and 226a. For example, the first number of the plurality of elastic structures 220 may be within a range of 4 to 8. The predetermined angle θ may be within a range of 40 degrees to 90 degrees.

The plurality of elastic structures 220 may include first to third structures 222, 224, and 226. The first to third structures 222, 224, and 226 may extend from the inner surface 214 of the frame 210 and may be connected to the loader blade 230. The first to third structures 222, 224, and 226 may stably support the loader blade 230 in the penetration region 212 of the frame 210.

In this specification, a horizontal direction (X direction) in which the first structures 222 extend may be referred to as a first horizontal direction, a horizontal direction (Y direction) perpendicular to the first horizontal direction may be referred to as a second horizontal direction. A direction (Z direction) perpendicular to the first horizontal direction and the second horizontal direction may be referred to as the vertical direction.

The first structures 222 may extend in the first horizontal direction (X direction). The first structures 222 may arrange the loader blade 230 between a pair of first structures 222. The second structures 224 may extend in the second horizontal direction (Y direction). The second structures 224 may arrange the loader blade 230 between a pair of second structures 224. For example, an angle between the first horizontal direction (X direction) and the second horizontal direction (Y direction) may be 90 degrees.

The third structures 226 may be provided between the first and second structures 222 and 224, respectively. The first structures 222, the second structures 224, and the third structures 226 may be provided on a same plane. The third structures 226 may extend in a third horizontal direction (P1 direction). The third horizontal direction (P1 direction) may extend between the first horizontal direction (X direction) and the second horizontal direction (Y direction). For example, the angle between the first horizontal direction (X direction) and the third horizontal direction (P1 direction) may be 45 degrees. The angle between the second horizontal direction (Y direction) and the third horizontal direction (P1 direction) may be 45 degrees.

For example, the third structure 226a may be provided between the first structure 222a and the second structure 224a. The third structure 226b may be provided between the first structure 222a and the second structure 224b. The third structure 226c may be provided between the first structure 222b and the second structure 224a. The third structure 226d may be provided between the first structure 222b and the second structure 224b.

The plurality of elastic structures 220 may include a structure that generates the elastic force. The plurality of elastic structures 220 may stably support the loader blade 230 through the elastic force. The plurality of elastic structures 220 may move the loader blade 230 by a predetermined height in the Z direction. The predetermined height may provide a longer travel distance to the load blade 230. For example, the predetermined height may be within a range of 300 µm to 500 µm. Since the predetermined height provides the longer travel distance to the load blade 230, the damage occurring within the semiconductor substrate 30 may be prevented.

The first structures 222 and the second structures 224 may have a same first form. The third structures 226 may have a same second form. The first and second forms may have different form to each other. The first and second forms may be designed differently depending on a degree of elasticity required. Alternatively, the first and second forms may have a same form.

When viewed from a side view, each of the plurality of elastic structures 220 may extend with repeated regular units. Each of the plurality of elastic structures 220 may include a meander structure extending in a zigzag pattern with the repeated regular units. The meander structure may provide the longer travel distance of the probe head 10. The plurality of elastic structures 220 may generate the elastic force through the meander structure. The plurality of elastic structures 220 may stably support the loader blade 230 through the meander structure. When each of the plurality of elastic structures 220 includes the meander structure, the load pusher 200 may be referred to as a Dolphin Spinner.

The plurality of elastic structures 220 may absorb stress that is applied into the loader blade 230 through the meander structure. When an unstable external force is applied to the loader blade, the plurality of elastic structures 220 may perform a twisting operation through the meander structure. Since the plurality of elastic structures 220 perform the twisting operation, the plurality of elastic structures 220 may stably absorb the stress that is applied to the loader blade 230.

Each of the plurality of elastic structures 220 may include a plurality of first extending portions 228 and a plurality of second extending portions 229. The first and second extending portions 228 and 229 may intersect each other, and may form the plurality of elastic structures 220, respectively. The first and second extending portions 228 and 229 may produce resistance to a distortion.

The plurality of first extending portions 228 may extend in the vertical direction (Z direction). Each of the plurality of first extending portions 228 may have a first width W1 in a fourth horizontal direction (P2 direction) perpendicular to the vertical direction (Z direction). The fourth horizontal direction may be perpendicular to a direction in which the plurality of elastic structures 220 extend.

The plurality of second extending portions 229 may extend between the plurality of first extending portions 228. The plurality of second extending portions 229 may form the meander structure between the plurality of first extending portions 228. Particularly, the plurality of second extending portions 229 may be arranged to intersect between the plurality of first extending portions 228 toward the first surface 220a and the second surface 220b.

Each of the plurality of second extending portions 229 may have a second width W2 in the fourth horizontal direction (P2 direction) perpendicular to the vertical direction (Z direction). The second width W2 of the second extending portions 229 may be smaller than the first width W1 of the first extending portions 228. Since the second width W2 of the second extending portions 229 is smaller than the first width W1 of the first extending portions 228, when the distortion occurs within the elastic structures 220, Stress occurring between the first extending portions 228 and the second extending portions 229 may be reduced. Since the stress occurring between the first extending portions 228 and the second extending portions 229 is reduced, the first and second extending portions 228, 229 may produce the resistance to the distortion.

Each of the plurality of elastic structures 220 may have a first spring distance SL. The first spring distance SL may be referred to as a movement range in which each of the plurality of elastic structures 220 is capable of being contraction or relaxation. The second extending portion 229a provided on the first surface 220a may have a first thickness Tu. The second extending portion 229b provided on the second surface 220b may have a second thickness Td. The first thickness Tu and the second thickness Td may have different values depending on a type of engineering plastic. A ratio SL/Tu of the first spring distance SL and the first thickness Tu may be within a range of 5 to 12. A ratio SL/Td of the first spring distance SL and the second thickness Td may be within a range of 5 to 12.

The second extending portion 229 between the first extending portions 228 may have a first length Sw. Each of the first extending portions 228 may have a first height Ht. The first height Ht of the first extending portion 228 may be referred to as a distance between the first surface 220a and the second surface 220b. The first height Ht may vary depending on the first spring distance SL.

A ratio Ht/Tu of the first height Ht and the first thickness Tu may be within a range of 4 to 5. The ratio SL/Ht of the first spring distance SL and the first height Ht may be within a range of 1.4 to 3. Alternatively, an ideal elastic effect may be generated when the ratio SL/Ht of the first spring distance SL and the first height Ht is 1.4 or more.

A ratio Sw/Ht of the first length Sw and the first height Ht may be within a range of 0.4 to 0.8. A minimum value of the first length Sw may vary depending on machining capability.

A distance from the first side 220a to the second extending portion 229 on the second side 220b may be referred to as a second length Sd. A distance from the second side 220b to the second extending portion 229 on the first side 220a may be referred to as a third length. The second length Sd and the third length may vary depending on the first height Ht.

The first extending portion 228 may have a first width Fw. The first width Fw of the first extending portion 228 may vary depending on the height Ht of the first extending portion 228. The first width Fw may vary depending on the first thickness Tu of the second extending portion 229. The first width Fw may vary depending on the second thickness Td of the second extending portion 229. The first width Fw may vary depending on the first thickness Sw of the second extension portion 229.

A ratio Sw/fw of the first length Sw and the first width Fw may be within a range of 0.2 to 1.0. The ratio Sw/fw of the first length Sw and the first width Fw may be changed to set a spring force of the elastic structures 220. The ratio Sw/fw of the first length Sw and the first width Fw may be changed to set a bending value of the elastic structures 220.

For example, the plurality of elastic structures 220 may include a second metal material. The second metal material may be the same as the first metal material of the frame 210. The plurality of elastic structures 220 may include copper (Cu), aluminum (Al), tungsten (W), nickel (Ni), molybdenum (Mo), gold (Au), silver (Ag), chromium (Cr), tin (Sn) and titanium (Ti).

In example embodiments, the loader blade 230 may have an upper surface 232 and a lower surface 234 opposite to the upper surface 232. The upper surface 232 of the loader blade 230 may be provided on a same plane as the upper portion of the load pusher 200.

The loader blade 230 may be connected to the frame 210 through the plurality of elastic structures 220. The loader blade 230 may protrude the test board 100 toward the semiconductor substrate 30. Since the loader blade 230 protrudes the test board 100 toward the semiconductor substrate 30, the test board 100 may accurately contact the semiconductor substrate 30. Since the test board 100 has the flexible structure, the test board 100 may accurately contact the semiconductor substrate 30 through the loader blade 230.

Since the loader blade 230 is connected to the frame 210 through the plurality of elastic structures 220, the loader blade 230 may be rotated. The loader blade 230 may be freely rotated up and down, left and right, and diagonally through the plurality of elastic structures 220. The loader blade 230 may perform a twisting movement through the plurality of elastic structures 220.

The loader blade 230 may have a protruding plane 234. The protruding plane 234 may be referred to as the lower surface 234. The loader blade 230 may stably press the test board 100 onto the semiconductor substrate 30 through the protruding plane 234. For example, the loader blade 230 may include a circular truncated cone shape, a frustum of quadrangular pyramid shape, a frustum of a square prism shape, etc.

The loader blade 230 may have a central axis CA. The elastic structures 220 may be arranged radially with respect to the central axis CA of the loader blade 230. The elastic structures 220 may be arranged along the circumferential direction with respect to the central axis CA of the loader blade 230.

The loader blade 230 may be exposed through the central opening of the probe card 40. The loader blade 230 may expose the test board 100 through the central opening. The loader blade 230 may contact the test board 100 that is exposed through the central opening onto the semiconductor substrate 30.

For example, the loader blade 230 may include copper (Cu), aluminum (Al), tungsten (W), nickel (Ni), molybdenum (Mo), gold (Au), silver (Ag), chromium (Cr), tin (Sn), and titanium (Ti).

For example, the loader blade 230 may include a third metal material. The third metal material may be the same as the first metal material of the frame 210 and the second metal material of the elastic structures 220. The loader blade 230 may include copper (Cu), aluminum (Al), tungsten (W), nickel (Ni), molybdenum (Mo), gold (Au), silver (Ag), chromium (Cr), tin (Sn), and titanium (Ti).

Since the frame 210, the elastic structures 220, and the loader blade 230 include the first to third metal materials that are the same as each other, the frame 210, the elastic structures 220, and the loader blade 230 may have an integrated structure. Since the frame 210, the elastic structures 220, and the loader blade 230 have the integrated structure, Epoxy might not be formed between the frame 210, the elastic structures 220, and the loader blade 230. Since the frame 210, elastic structures 220, and loader blade 230 do not include the epoxy, the probe head 10 may perform the reliability test at high or extremely low temperatures for a long time.

Alternatively, the frame 210 may include a first plastic material. The plurality of elastic structures 220 may include a second plastic material. The loader blade 230 may include a third plastic material. The first to third plastic materials may be the same as each other.

For example, the first to third plastic materials may include polyethylene (PE), polypropylene (PP), polystyrene (PS), polyethylene terephthalate (PET), and polyamides. PA), polyester (PES), polyvinyl chloride (PVC), polyurethanes (PU), polycarbonate (PC), polyvinylidene chloride (PVDC), etc.

In example embodiments, the support tensioner 300 may be provided on the upper portion of the load pusher 200. The support tensioner 300 may restrict a movement of the load pusher 200. Since the load pusher 200 rotates by the plurality of elastic structures 220, the support tensioner 300 may stably limit the movement of the rotating load pusher 200. Since the support tensioner 300 safely limits the movement of the load pusher 200, the reliability test may be performed stably.

The support tensioner 300 may include a plurality of spring pins 310. The support tensioner 300 may perform calibration on the load pusher 200 through the plurality of spring pins 310. The plurality of spring pins 310 may include spring probe pins.

The plurality of spring pins 310 may be arranged on the upper surface 232 of the loader blade 230. The plurality of spring pins 310 that are arranged on the upper surface 232 of the loader blade 230 may pressurize a region of the upper surface 232 of the loader blade 230 that rises excessively. Since the plurality of spring pins 310 pressurize the region of the upper surface 232 that rises excessively, a movement of the loader blade 230 may be restricted. For example, the number of spring pins 310 may be within a range of 30 to 50. The number of spring pins may be referred to as the number being capable of checking wafer die size up to 10×10 mm. Bigger sized wafer die or chip may require the additional number of spring pins.

The plurality of spring pins 310 may be arranged to be symmetrical to each other with respect to a first reference axis A1. The plurality of spring pins 310 may be arranged to be symmetrical to each other with respect to a second reference axis A2. The first reference axis A1 may pass through the central axis CA of the loader blade 230. The second reference axis A2 may pass through the central axis CA of the loader blade 230. The first reference axis A1 and the second reference axis A2 may be perpendicular to each other. Since the plurality of spring pins 310 are arranged to be symmetrical to each other with respect to the first and second reference axes A1 and A2, the plurality of spring pins 310 may entirely cover the upper surface 232 of the loader blade 230. Since the plurality of spring pins 310 entirely cover the upper surface 232 of the loader blade 230, the plurality of spring pins 310 may stably support the loader blade 230 according to a direction in which the loader blade 230 rotates.

The plurality of spring pins 310 may be arranged to be spaced apart from each other to have a same predetermined distance between adjacent pins 310a and 310b. Since the adjacent pins 310a and 310b are spaced apart from each other to have the same predetermined distance, the plurality of spring pins 310 may entirely cover the upper surface 232 of the load pusher 200.

For example, the plurality of spring pins 310 may include a fourth metal material. The plurality of spring pins 310 may include copper (Cu), aluminum (Al), tungsten (W), nickel (Ni), molybdenum (Mo), gold (Au), silver (Ag), chromium (Cr), tin (Sn), and titanium (Ti).

The plurality of spring pins 310 may include pogo pins. Each of the plurality of spring pins 310 may include a cylindrical body 312 having opened one side, a contact pin 314 provided inside the body 312, and spring 316 applying an elastic force on the contact pin 314. The contact pin 314 may be provided on the opened one side inside the body 312. The contact pin 314 may directly contact the upper surface 232 of the loader blade 230. The spring 316 may be provided within body 312. The spring 316 may apply an elastic force to the contact pin 314 within the body 312 toward the opened one side. The contact pin 314 may protrude from the cylindrical body 312 by a first distance D1. For example, the first distance D1 may be within a range of 500 μm to 800 μm. An end of the contact pin 314 may include a hemisphere shape, a circular cone shape, a quadrangular pyramid shape, a hemisphere shape, a circular truncated cone shape, and a frustum of quadrangular pyramid.

In example embodiments, the probe head 10 may further include a first fixing block 400 surrounding the support tensioner 300, a locator 410 indicating a position of the support tensioner 300, a plurality of hard stoppers 420 controlling the position of the support tensioner 300 through the locator 410, and a second fixing block 430 provided on the locator 410. The probe head 10 may further include a first spring set 440 provided between the second fixing block 430 and the locator 410, and a second spring set 450 provided between the first fixing block 400 and the locator 410.

The first fixing block 400 may be placed on the load pusher 200, and the first fixing block 400 may surround the support tensioner 300. The first fixing block 400 may stably support the support tensioner 300 on the load pusher 200.

The locator 410 may be provided on the first fixing block 400 and the support tensioner 300. The locator 410 may press the support tensioner 300 in the vertical direction (Z direction). The locator 410 may be disposed via the second spring set 450 on the first fixing block 400, and the second spring set 450 may elastically support the locator 410.

The plurality of hard stoppers 420 may be controlled between the locator 410 and the first fixing block 400. When the hard stoppers 420 press the locator 410 toward the first fixing block 400, a distance between the locator 410 and the first fixing block 400 may be reduced. The hard stoppers 420 may be uniformly arranged on the first fixing block 400, and may comprehensively control the position of the locator 410.

The locator 410 may include a plurality of protrusions 412 that protrude toward the first horizontal direction (X direction) and the second horizontal direction (Y direction). At least one of the plurality of protrusions 412 may be referred to as a location fin. In a process of the hard stoppers 420 controlling the position of the locator 410, the plurality of protrusions 412 may indicate the location of the locator 410. The plurality of protrusions 412 may protrude toward an outside of the probe head 10 between the first and second fixing blocks 400 and 430.

The second fixing block 430 may pressurize the locator 410 through the first spring set 440. Since the first spring set 440 press the locator 410, external force may be transmitted to the support tensioner 300 that is in contact with the locator 410. When a rotational force of the loader blade 230 is transmitted to the support tensioner 300, the second fixing block 430 may limit a movement of the support tensioner 300 through the first spring set 440.

The first fixing block 400 and the second fixing block 430 may include a fifth metal material. Since the plurality of spring pins 310 include the fourth metal material, the first fixing block 400 and the second fixing block 430 include the fifth metal material, Electromagnetic wave shielding (EMI shielding) function may be improved. Since the fourth and fifth metal materials have good electrical conduction properties, the electromagnetic wave shielding function may be improved. The loader blade 230, the support tensioner 300, the first fixing block 400, and the second fixing block 430 may improve the electromagnetic wave shielding function during the process of performing the reliability test through the third to fifth metal materials. For example, the fifth metal material may include copper (Cu), aluminum (Al), tungsten (W), nickel (Ni), molybdenum (Mo), gold (Au), silver (Ag), chromium (Cr), tin (Sn) and titanium (Ti).

As described above, the load pusher 200 of the probe head 10 may contact the test board 100 onto the semiconductor substrate 30, and the test board 100 may test the reliability of the semiconductor substrate 30. While the load pusher 200 presses the test board 100 toward the semiconductor substrate 30, the plurality of elastic structures 220 may rotate the loader blade 230. Since the plurality of elastic structures 220 are spaced apart from each other along the circumferential direction to have the predetermined angle θ, while the loader blade 230 presses the test board 100 onto the semiconductor substrate 30, the plurality of elastic structures 220 may stably support rotation motion of the loader blade 230.

Since the loader blade 230 is rotated by the plurality of elastic structures 220, when the test board 100 is located on an edge region of the semiconductor wafer, the loader blade 230 may evenly transmit external force onto the semiconductor substrate 30. Since the loader blade 230 evenly transmits the external force onto the semiconductor substrate 30, damage occurring within the semiconductor substrate 30 may be reduced, and damage of the load pusher 200 may be prevented.

Also, the frame 210, the plurality of elastic structures 220, and the loader blade 230 may include the same first to third materials. The frame 210, the plurality of elastic structures 220, and the loader blade 230 may be provided as the integrated structure. Since the frame 210, the plurality of elastic structures 220, and the loader blade 230 are formed as the integrated structure and do not have epoxy for bonding, the probe head 10 may perform the reliability tests at high or extremely low temperatures for a long time.

Hereinafter, the process of performing the reliability test using the substrate inspection device will be described.

Figure 9:
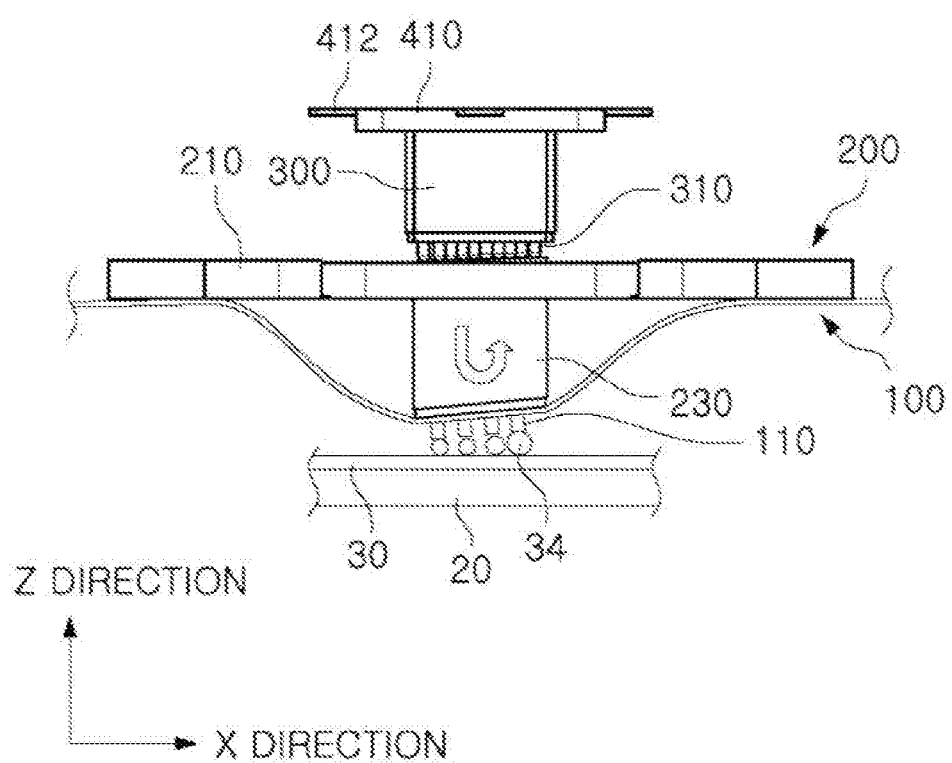
Figure 10:
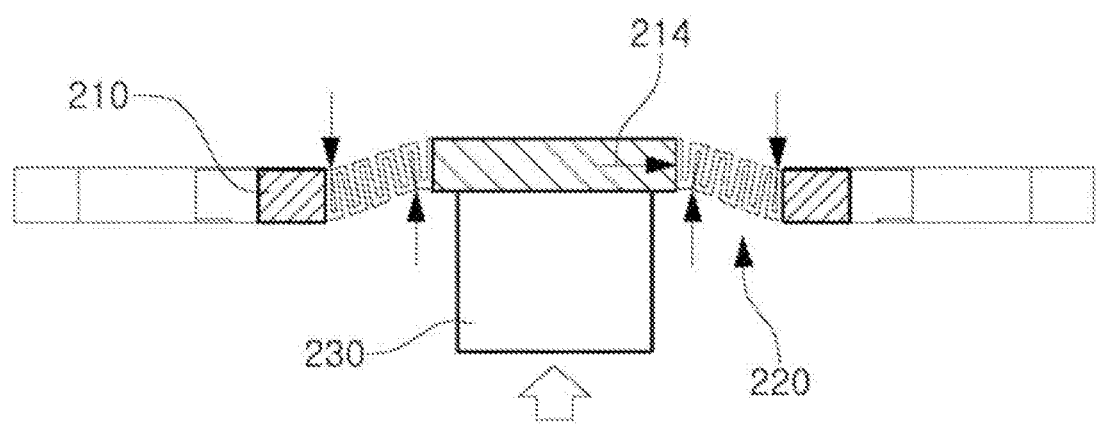

FIG. 9 is a front view illustrating a probe head in a process of testing a reliability of a semiconductor substrate using the substrate inspection device in FIG. 1. FIG. 10 is a view illustrating the load pusher in FIG. 9 in a process of testing a reliability of a semiconductor substrate.

Referring to FIGS. 9 and 10, first, the semiconductor substrate 30 may be loaded on the substrate plate 20. Then, the probe head 10 may be placed on the semiconductor substrate 30.

In example embodiments, the substrate plate 20 may move the semiconductor substrate 30 toward the probe head 10, and the semiconductor substrate 30 may be pressurized between the substrate plate 20 and the probe head 10. Alternatively, the probe head 10 may move toward the semiconductor substrate 30 on the substrate plate 20.

The plurality of tips 110 of the test board 100 may contact the bonding pad, the connecting pad, and the solder bump of the semiconductor substrate 30. When the tips 110 of the test board 100 are in contact with the semiconductor substrate 30, the load pusher 200 may pressurize the test board 100.

When the load pusher 200 presses the test board 100, the loader blade 230 may be rotated by the plurality of elastic structures 220. For example, when a defective solder bump 34 having an abnormal size is provided on the semiconductor substrate 30, a strong impact may occur on the defective solder bump 34. Since the loader blade 230 is rotated by the plurality of elastic structures 220, the strong impact generated on the defective solder bump 34 may be absorbed by the plurality of elastic structures 220. Since the strong impact is absorbed by the plurality of elastic structures 220, damage occurring within the semiconductor substrate 30 and impact occurring within the load pusher 200 may be prevented.

As illustrated in FIG. 10, the plurality of elastic structures 220 may have the meander structure. The plurality of elastic structures 220 may change depending on an external force that is applied to the loader blade 230 through the meander structure, and may absorb the strong impact.

The plurality of elastic structures 200 may contact each other through the meander structure, and may limit the movement of the loader blade 230. Particularly, when external pressure is applied to the loader blade 230, at least portions of each of the plurality of elastic structures 200 in contact with the frame 210 and the loader blade 230 may contact each other through the meander structure. Since the at least portions of each of the plurality of elastic structures 200 contacts each other through the meander structure, the movement of the loader blade 230 may be restricted.

Figure 11:
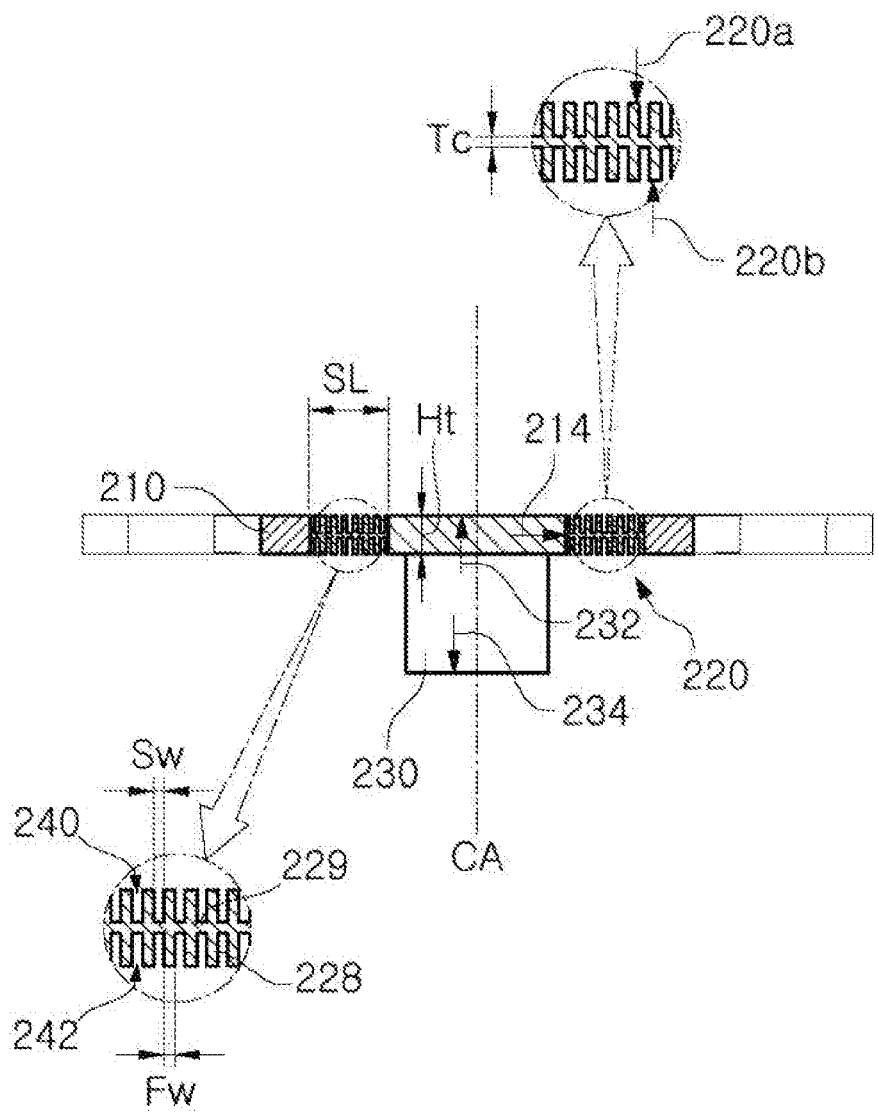
Figure 12:
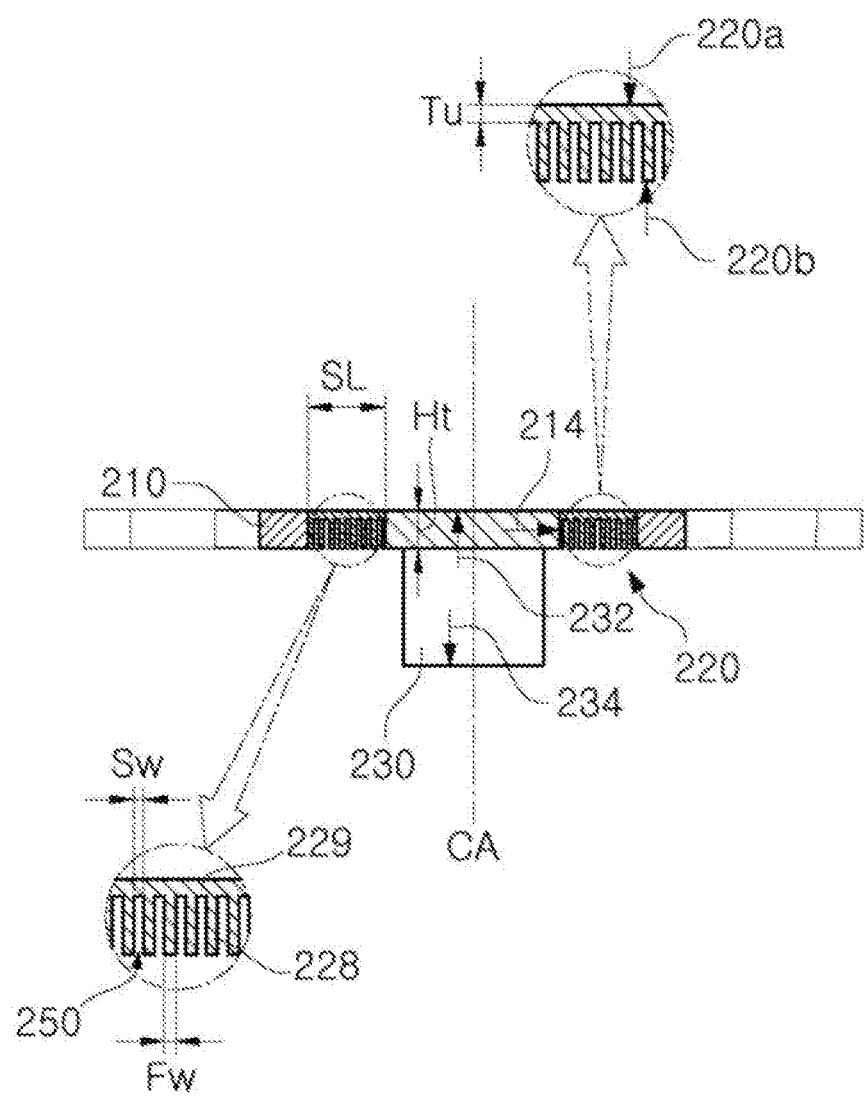

FIGS. 11 and 12 are view illustrating load pushers in accordance with example embodiments. The load pushers may be substantially the same as or similar to the load pusher described with reference to FIGS. 2 to 10 except for a configuration of the plurality of elastic structures. Thus, same or similar components are denoted by the same or similar reference numerals, and repeated descriptions of the same components will be omitted.

Referring to FIG. 11, each of the plurality of elastic structures 220 may have the first surface 220a and the second surface 220b opposite to the first surface 220a. Each of the plurality of elastic structures 220 may include a plurality of first and second patterns 240 and 242 that extend from the first and second surfaces 220a and 220b toward each other, respectively.

Each of the plurality of elastic structures 220 may include a plurality of first extending portions 228 and a plurality of second extending portions 229. The first and second extending portions 228 and 229 may intersect each other and may form the plurality of elastic structures 220, respectively. The first and second extending portions 228 and 229 may intersect each other and may form the first and second patterns 240 and 242. The first and second extending portions 228 and 229 may generate resistance to the distortion.

The plurality of first extending portions 228 may extend in the vertical direction (Z direction). The plurality of second extending portions 229 may extend between the plurality of first extending portions 228. The plurality of second extending portions 229 may be provided in a center of each of the plurality of first extending portions 228 between the first and second surfaces 220a and 220b. Tensile force may be controlled depending on a position of the plurality of second extending portions 229 between the plurality of first extending portions 228.

When the plurality of elastic structures 220 include the first and second patterns 240 and 242, the load pusher 200 may be referred to as a dolphin bottlenose.

Referring to FIG. 12, each of the plurality of elastic structures 220 may have the first surface 220a and the second surface 220b opposite to the first surface 220a. Each of the plurality of elastic structures 220 may include a plurality of third patterns 250 extending from the second surface 220b, respectively.

Each of the plurality of elastic structures 220 may include the plurality of first extending portions 228 and the plurality of second extending portions 229. The first and second extending portions 228 and 229 may intersect each other and may form the plurality of elastic structures 220, respectively. The first and second extending portions 228 and 229 may intersect each other to form the third patterns 250. The first and second extending portions 228 and 229 may generate resistance to the distortion.

The plurality of first extending portions 228 may extend in the vertical direction (Z direction). The plurality of second extending portions 229 may extend between the plurality of first extending portions 228. The plurality of second extending portions 229 may be provided along the first surface 220a between the plurality of first extending portions 228. The second extending portions 229 may control force in the vertical direction (Z direction). Specifically, the second extending portions 229 may reduce a downward force in the vertical direction (Z direction), and the second extending portions 229 may increase an upward force in the vertical direction (Z direction).

Alternatively, the plurality of second extending portions 229 may be provided along the second surface 220b between the plurality of first extending portions 228. The second extending portions 229 may increase the downward force in the vertical direction (Z direction), and the second extensions 229 may reduce the upward force in the vertical direction (Z direction).

When the plurality of elastic structures 220 include the third patterns 250, the load pusher 200 may be referred to as a Dolphin Amazon.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A probe head, comprising:
   a test board configured to test a reliability of a semiconductor substrate by contacting the semiconductor substrate;
   a load pusher provided on the test board, the load pusher including a frame, a plurality of elastic structures, and a loader blade, the frame having a penetration region, the plurality of elastic structures extending from an inner surface of the frame within the penetration region and spaced apart from each other along a circumferential direction, the loader blade configured to protrude the test board toward the semiconductor substrate, the loader blade connecting to the frame through the plurality of elastic structures; and
   a support tensioner configured to support the load pusher,
   wherein each of the plurality of elastic structures includes:
   a plurality of first extending portions extending in a vertical direction and having a first width in a horizontal direction perpendicular to the vertical direction, the horizontal direction being perpendicular to a direction in which each of the plurality of elastic structures extends; and
   a plurality of second extending portions extending between the plurality of first extending portions and having a second width smaller than the first width in the horizontal direction.

2. The probe head of claim 1, wherein each of the plurality of elastic structures has a meander structure extending in a zigzag pattern with repeated regular units.

3. The probe head of claim 1, wherein each of the plurality of elastic structures has a first surface and a second surface opposite to the second surface, the first surface and the second surface face to each other in the vertical direction, and each of the plurality of elastic structures has a plurality of first and second patterns respectively extending from the first and second surfaces toward each other.

4. The probe head of claim 1, wherein each of the plurality of elastic structures has a first surface and a second surface opposite to the second surface, the first surface and the second surface face to each other in the vertical direction, and each of the plurality of elastic structures has a plurality of third patterns respectively extending from the first surface.

* * * * *